(12) United States Patent
Lee et al.

(10) Patent No.: US 12,512,840 B2
(45) Date of Patent: Dec. 30, 2025

(54) APPARATUS, METHOD AND RECORDING MEDIUM FOR DIGITAL CLOCK AND DATA RECOVERY

(71) Applicant: Foundation for Research and Business, Seoul National University of Science and Technology, Seoul (KR)

(72) Inventors: Won Young Lee, Seoul (KR); Hyun Bin Lee, Seoul (KR)

(73) Assignee: Foundation for Research and Business, Seoul National University of Science and Technology, Seoul (KR)

( * ) Notice: Subject to any disclaimer, the term of this patent is extended or adjusted under 35 U.S.C. 154(b) by 193 days.

(21) Appl. No.: 18/420,807

(22) Filed: Jan. 24, 2024

(65) Prior Publication Data

US 2024/0396559 A1 Nov. 28, 2024

(30) Foreign Application Priority Data

May 25, 2023 (KR) .................. 10-2023-0067335

(51) Int. Cl.
*H03L 7/08* (2006.01)
*H03L 7/093* (2006.01)
*H03L 7/095* (2006.01)
*H04L 7/02* (2006.01)

(52) U.S. Cl.
CPC .......... *H03L 7/0807* (2013.01); *H03L 7/093* (2013.01); *H03L 7/095* (2013.01); *H04L 7/02* (2013.01)

(58) Field of Classification Search
CPC ....... H03L 7/0807; H03L 7/093; H03L 7/095; H04L 7/02
See application file for complete search history.

(56) References Cited

U.S. PATENT DOCUMENTS

| | | | |
|---|---|---|---|
| 7,257,183 B2* | 8/2007 | Dally | H04L 7/0331 331/DIG. 2 |
| 8,427,219 B1* | 4/2013 | Wu | H03L 7/113 327/155 |
| 9,793,902 B2 | 10/2017 | Lakshimikumar et al. | |
| 2008/0238505 A1* | 10/2008 | Chatterjee | H03L 7/099 327/156 |
| 2013/0070882 A1* | 3/2013 | Nedovic | H03L 7/235 375/373 |

(Continued)

FOREIGN PATENT DOCUMENTS

| | | | |
|---|---|---|---|
| KR | 100153953 B1 | 7/1998 | |
| KR | 100297857 B1 | 5/2001 | |

(Continued)

*Primary Examiner* — Freshteh N Aghdam
(74) *Attorney, Agent, or Firm* — NKL Law; Jae Youn Kim

(57) ABSTRACT

Proposed is an apparatus for a digital clock and data recovery. The apparatus includes a frequency detector for detecting a high frequency (FH) signal, a low frequency (FL) signal and ultra-high frequency (FUH) signal by determining the relationship between an input data rate and a clock frequency, and generating a continuous frequency up (CFUP) signal and a continuous frequency down (CFDN) signal based on the FH, FL and FUH signals; and a digital loop filter (DLF) for controlling to adjust a clock frequency in a coarse adjustment stage using the CFUP and CFDN signals and to adjust a clock frequency in a fine adjustment stage using the FH and FL signals.

13 Claims, 16 Drawing Sheets

(56) References Cited

U.S. PATENT DOCUMENTS

2016/0380639 A1   12/2016   Chen et al.
2017/0019116 A1   1/2017    Chen et al.

FOREIGN PATENT DOCUMENTS

| KR | 20060106552 A | 10/2006 |
|---|---|---|
| KR | 100707230 B1 | 4/2007 |
| KR | 20080018502 A | 2/2008 |
| KR | 20110014769 A | 2/2011 |
| KR | 20110114138 A | 10/2011 |
| KR | 20120133685 A | 12/2012 |
| KR | 101252190 B1 | 4/2013 |
| KR | 101327221 B1 | 11/2013 |
| KR | 20140126033 A | 10/2014 |
| KR | 20200005971 A | 1/2020 |
| KR | 20210075730 A | 6/2021 |
| KR | 20220013921 A | 2/2022 |

* cited by examiner

APPARATUS, METHOD AND RECORDING MEDIUM FOR DIGITAL CLOCK AND DATA RECOVERY

TECHNICAL FIELD

The present invention relates to an apparatus, method, and recording medium for a digital clock and data recovery (CDR).

BACKGROUND OF THE INVENTION

For reasons such as integration and high speed of systems, transmission apparatuses need a high-speed serial communication scheme rather than the existing parallel communication scheme. In general, standards used in high-speed serial communication scheme have a data rate of hundreds to thousands of gigabits (bits per second), and only data is transmitted without transmitting a separate clock signal or data with information about the clock signal included therein is transmitted. Accordingly, a receiving apparatus needs a CDR circuit that extracts clock information from data transmitted by a transmitting apparatus and synchronizes them with the data.

The CDR circuit refers to a circuit that recovers received data by generating a clock suitable for the data rate, and plays an important role at a receiving stage of a high-speed interface system. Important performance indicators for the CDR circuit which are dealt with in the present invention include a fast frequency acquisition time, a wide capture range and the like.

There are problems that in the CDR circuit, the longer the lock time for reasons such as slow frequency acquisition time, the more likely data loss will occur, and as the capture range is limited, the range of recoverable data rates is reduced or limited.

SUMMARY OF THE INVENTION

The present invention has been created to solve the above problems, and the object of the present invention relates to providing a CDR apparatus and method.

Other object of the present invention relates to providing a CDR apparatus and method for recovering received data by detecting the relationship between an input data rate and a clock frequency and adjusting the clock frequency to suit the input data using the detected signal.

An apparatus for digital clock data recovery (CDR) according to an embodiment of the present invention for achieving the object may comprise a frequency detector for detecting a high frequency (FH) signal, a low frequency (FL) signal and ultra-high frequency (FUH) signal by determining the relationship between an input data rate and a clock frequency, and generating a continuous frequency up (CFUP) signal and a continuous frequency down (CFDN) signal based on the FH, FL and FUH signals; and a digital loop filter (DLF) for controlling to adjust a clock frequency in a coarse adjustment stage using the CFUP and CFDN signals and to adjust a clock frequency in a fine adjustment stage using the FH and FL signals.

A method for digital clock data recovery (CDR) according to an embodiment of the present invention for achieving the object may comprise the steps of detecting, by a frequency detector, a high frequency (FH) signal, a low frequency (FL) signal and ultra-high frequency (FUH) signal by determining the relationship between an input data rate and a clock frequency; generating, by the frequency detector, a continuous frequency up (CFUP) signal and a continuous frequency down (CFDN) signal based on the FH, FL and FUH signals; and controlling, by a digital loop filter (DLF), to adjust a clock frequency in a coarse adjustment stage using the CFUP and CFDN signals and to adjust a clock frequency in a fine adjustment stage using the FH and FL signals.

According to one aspect of the present invention described above, the present invention has the effect of minimizing data loss by reducing a frequency acquisition time and a lock time to thereby enable a fast clock signal recovery. Furthermore, the present invention has the advantage of ensuring harmonic lock prevention so that the CDR circuit can operate correctly and provide higher performance and safety.

DETAILED DESCRIPTION OF THE INVENTION

Figure 1:
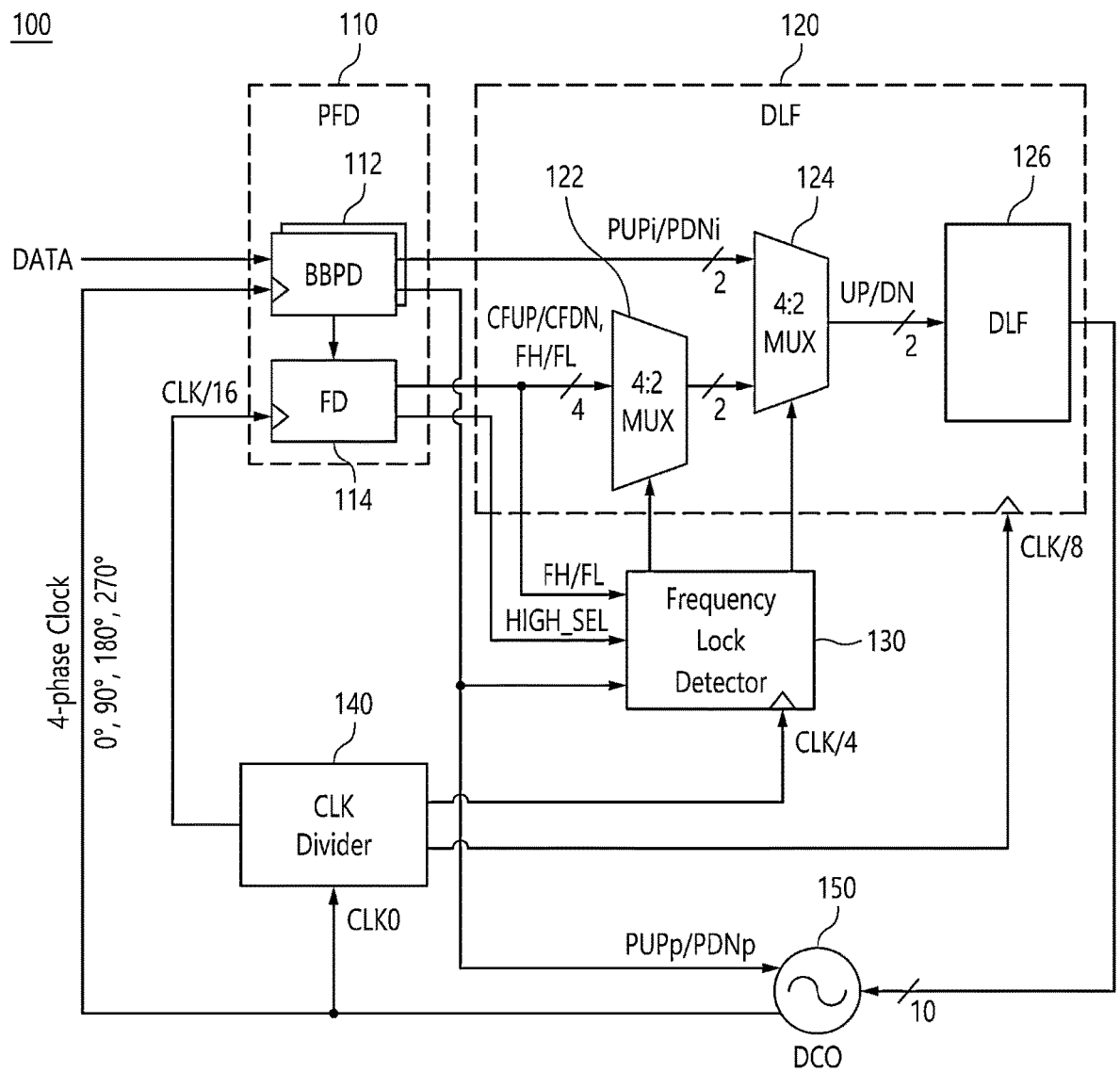
FIG. 1 is an apparatus diagram showing the internal blocks of a CDR circuit according to an embodiment of the present invention.

The detailed description of the present invention described below refers to the accompanying drawings, which show by way of example specific embodiments in which the present invention may be practiced. These embodiments are described in sufficient detail to enable those skilled in the art to practice the invention. It should be understood that the various embodiments of the present invention are different from one another but are not necessarily mutually exclusive. For example, specific shapes, structures and features described herein may be implemented in other embodiment without departing from the spirit and scope of the invention in connection with one embodiment. Additionally, it should be understood that the location or arrangement of individual components within each disclosed embodiment may be changed without departing from the spirit and scope of the invention. Accordingly, the following detailed description is not intended to be taken in a limiting sense, and the scope of the invention is limited only by the appended claims, together with all equivalents to what those claims claim, if properly described. Similar reference numerals in the drawings refer to identical or similar functions across various aspects.

The components according to the present invention are components defined by functional division rather than physical division, and can be defined by the functions that each component performs. Each component may be implemented as hardware or program code and processing units that perform each function, and the functions of two or more components may be included and implemented in one component. Therefore, it should be noted that the names given to the components in the following embodiments are not intended to physically divide respective components, but are given to imply the representative function performed by respective components, and that the technical idea of the present invention is not limited to the names of the components.

Hereinafter, preferred embodiments of the present invention will be described in more detail with reference to the drawings.

FIG. 1 is an apparatus diagram showing the internal blocks of a CDR circuit according to an embodiment of the present invention.

Referring to FIG. 1, the illustrated CDR circuit 100 includes a bang-bang phase detector (BBPD) 112, a frequency detector (FD) 114, and multiplexers (MUXs) 122 and 124, a digital loop filter (DLF) 126, a frequency lock detector 130, a clock divider (CLKDIV) 140 and a digital controlled oscillator (DCO) 150.

In an embodiment of the present invention, the BBPD 112 and the FD 114 included in the CDR circuit 100 are defined as the phase frequency detector (PFD) part 110, and the two MUXs 122 and 124 and the DLF 126 are defined as the DLF part 120.

Figure 2:
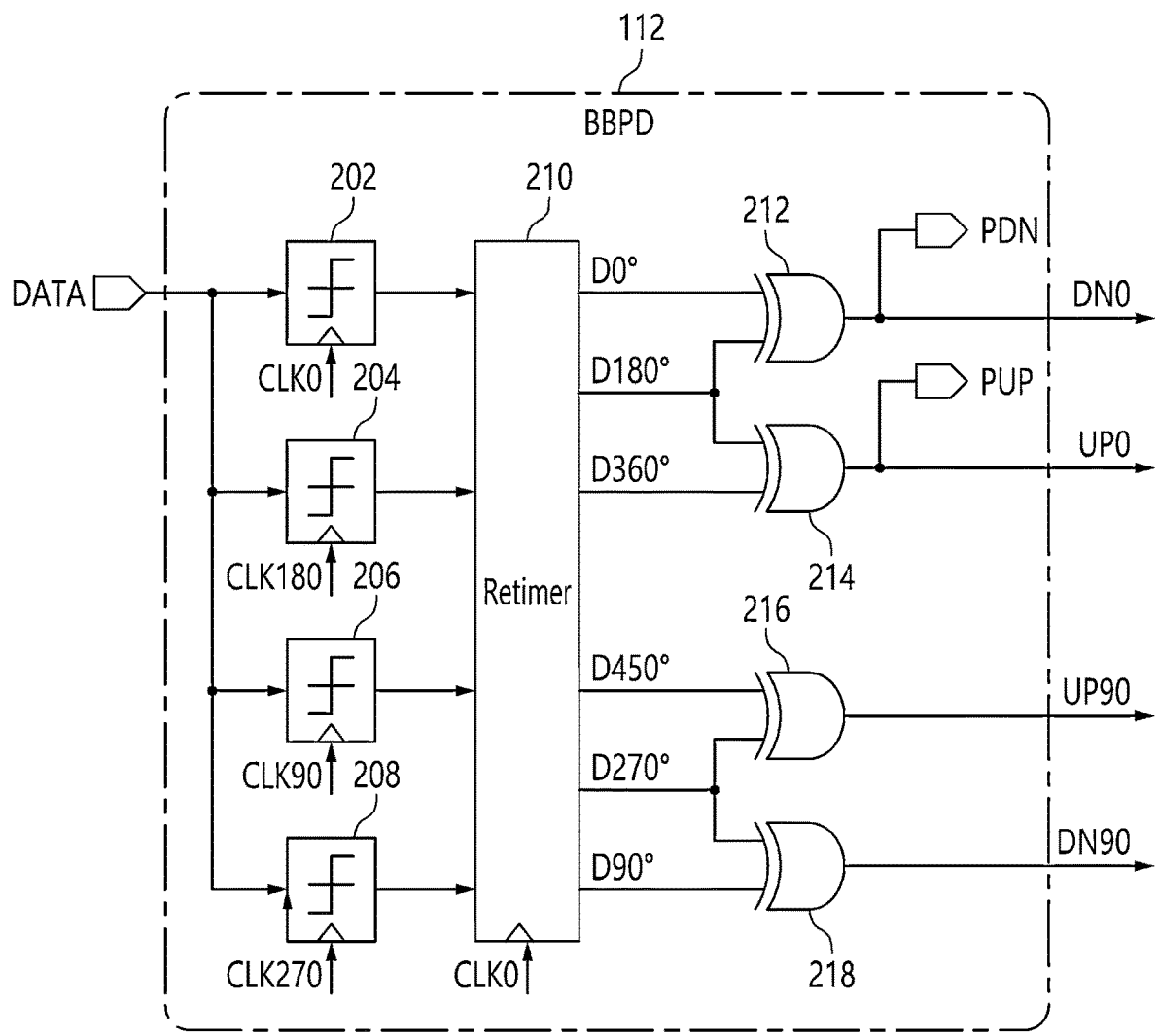
FIG. 2 is an apparatus diagram showing the internal blocks of two BBPDs included in the PFD part of FIG. 1.

FIG. 2 is an apparatus diagram showing the internal blocks of the BBPD included in the PFD part of FIG. 1.

Referring to FIG. 2, the illustrated BBPD 112 includes four sense amplifiers 202, 204, 206 and 208 to which clock signals of different phases are inputted, a retimer 210, and four exclusive OR (XOR) gates 212, 214, 216 and 218.

The BBPD 112 receives clock signals with four phases 0°, 90°, 180° and 270°, which are the outputs of the DCO 150 shown in FIG. 1, through the sense amplifiers 202, 204, 206 and 208, samples these data and then realigns them to a clock with a 0° phase through the retimer 210 so as to align the data at the same clock phase. That is, the values having input data values detected at 0°, 90°, 180°, 270°, 3600 and 450° phases aligned into the same phase are D0°, D90°, D180°, D270°, D360° and D450°, respectively.

The XOR gate 212 receives the sampled and realigned data D0° and D180° and outputs DN0, and the XOR gate 214 receives the sampled and realigned data D180° and D360° and outputs UP0. The XOR gate 216 receives the sampled and realigned data D450° and D270° and outputs UP90, and the XOR gate 218 receives the sampled and realigned data D270° and D90° and outputs DN90.

Figure 3A:
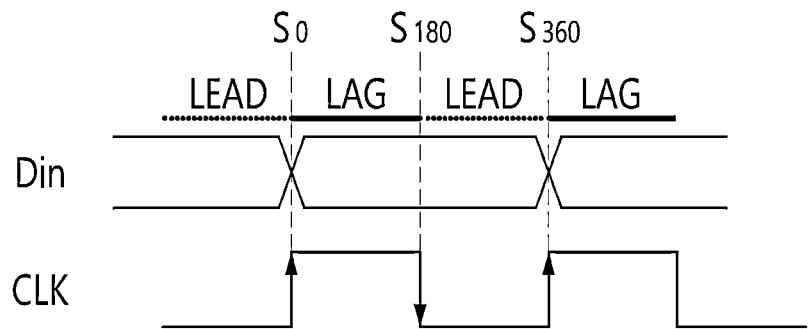
FIGS. 3a-3c are diagrams showing an example to explain the principle of BBPD for detecting the phase difference between an input data signal and a clock signal.
Figure 3B:
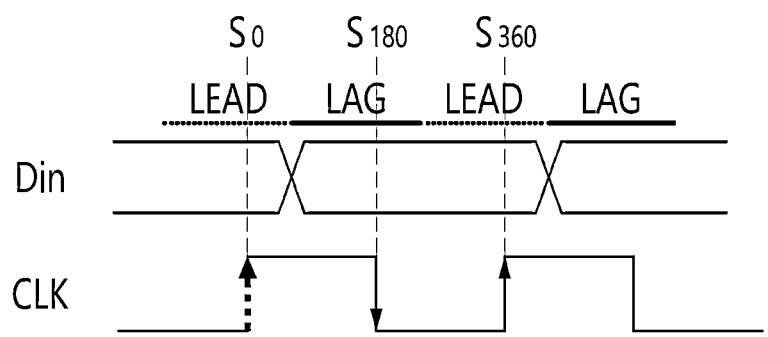
Figure 3C:
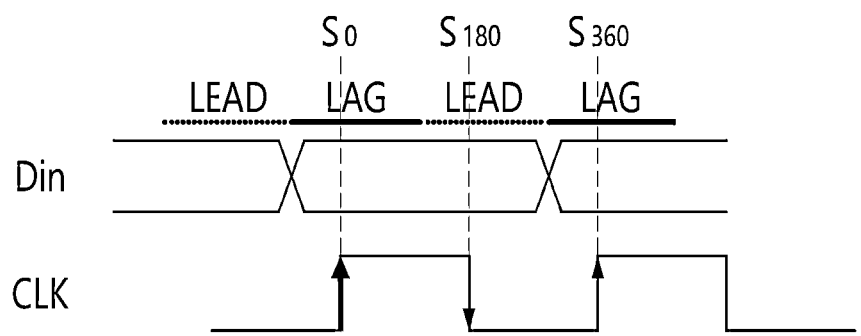

FIGS. 3a-3c are diagrams showing an example to explain the principle of a typical BBPD of detecting the phase difference between an input data signal and a clock signal. In FIGS. 3a-3c, it is assumed that the clock frequency and input data rate are the same.

Referring to FIGS. 3a-3c, $S_0$ is data sampled at the 0° phase of the clock, $S_{180}$ is data sampled at the 180° phase of the clock, and $S_{360}$ is data sampled at the 360° phase of the clock. The BBPD compares $S_0$ with $S_{180}$ and $S_{180}$ with $S_{360}$ using the XOR gate, and determines the phase difference between the clock signal and input data based on the comparison results. Furthermore, in an embodiment of the present invention, the area (lag/lead) where the edge of the clock signal is located is determined based on the comparison results.

In more detail, FIG. 3a shows the case where the phase error is 0, which is equivalent to $S_0 \oplus S_{180} = S_{180} \oplus S_{360}$. In this case, the transition point of the input data signal ($D_{in}$) and the rising edge of the clock signal ($C_{lk}$) coincide with together and therefore, the frequency of the clock signal is not adjusted.

FIG. 3b shows the case where the rising edge of the clock signal is ahead of the transition point of the data input signal, which is equivalent to $S_0 \oplus S_{180} = 1$, $S_{180} \oplus S_{360} = 0$. In this case, the first rising edge of the clock signal is located in the LEAD area, so the frequency of the clock signal is adjusted in the phase detection stage. In other words, the frequency of the clock signal is controlled to decrease thereby matching the transition point of the input data signal and the rising edge of the clock signal.

FIG. 3c shows the case where the rising edge of the clock signal is located behind the transition point of the data input signal, which is equivalent to $S_0 \oplus S_{180} = 0$, $S_{180} \oplus S_{360} = 1$. In this case, the first rising edge of the clock signal is located in the LAG area, so the frequency of the clock signal is adjusted in the phase detection stage. In other words, the frequency of the clock signal is controlled to increase thereby matching the transition point of the input data signal and the rising edge of the clock signal.

As such, the BBPD generates signals such as DN0, UP0, DN90 and UP90 by a combination of sampled data and outputs them to the FD.

Figure 4:
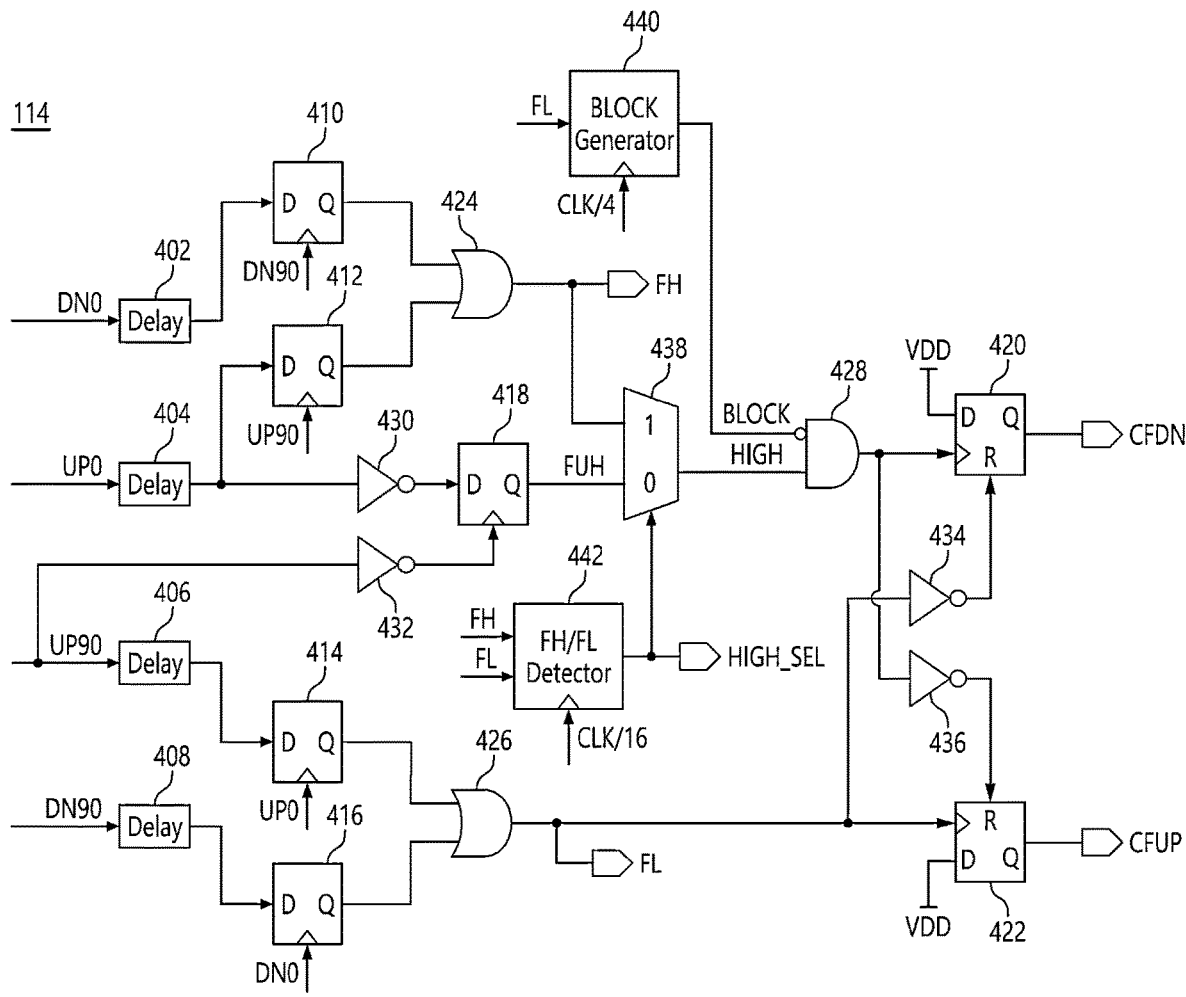
FIG. 4 is an apparatus diagram showing the internal blocks of the FD included in the PFD part of FIG. 1.

FIG. 4 is an apparatus diagram showing the internal blocks of the FD included in the PFD part of FIG. 1.

Referring to FIG. 4, the illustrated FD 114 includes delays 402, 404, 406 and 408, D Flip Flops (DFF) 410, 412, 414, 416, 418, 420 and 422, OR gates 424 and 426, an AND gate 428, and NOT gates 430, 432, 434 and 436, a MUX 438, a block signal generator 440, and a high frequency (FH)/low frequency (FL) detector 442.

Upon receiving the output signals DN0, UP0, DN90 and UP90 of the BBPD 112 described in FIG. 2, the FD 114 determines whether the clock frequency is higher or lower than the data rate of the input data and outputs an ultra-high frequency (FUH), FH and FL signals. The operation of the FD 114 to output the FUH, FH, and FL signals will be described in more detail with reference to FIGS. 5a to 7b below.

Figure 5A:
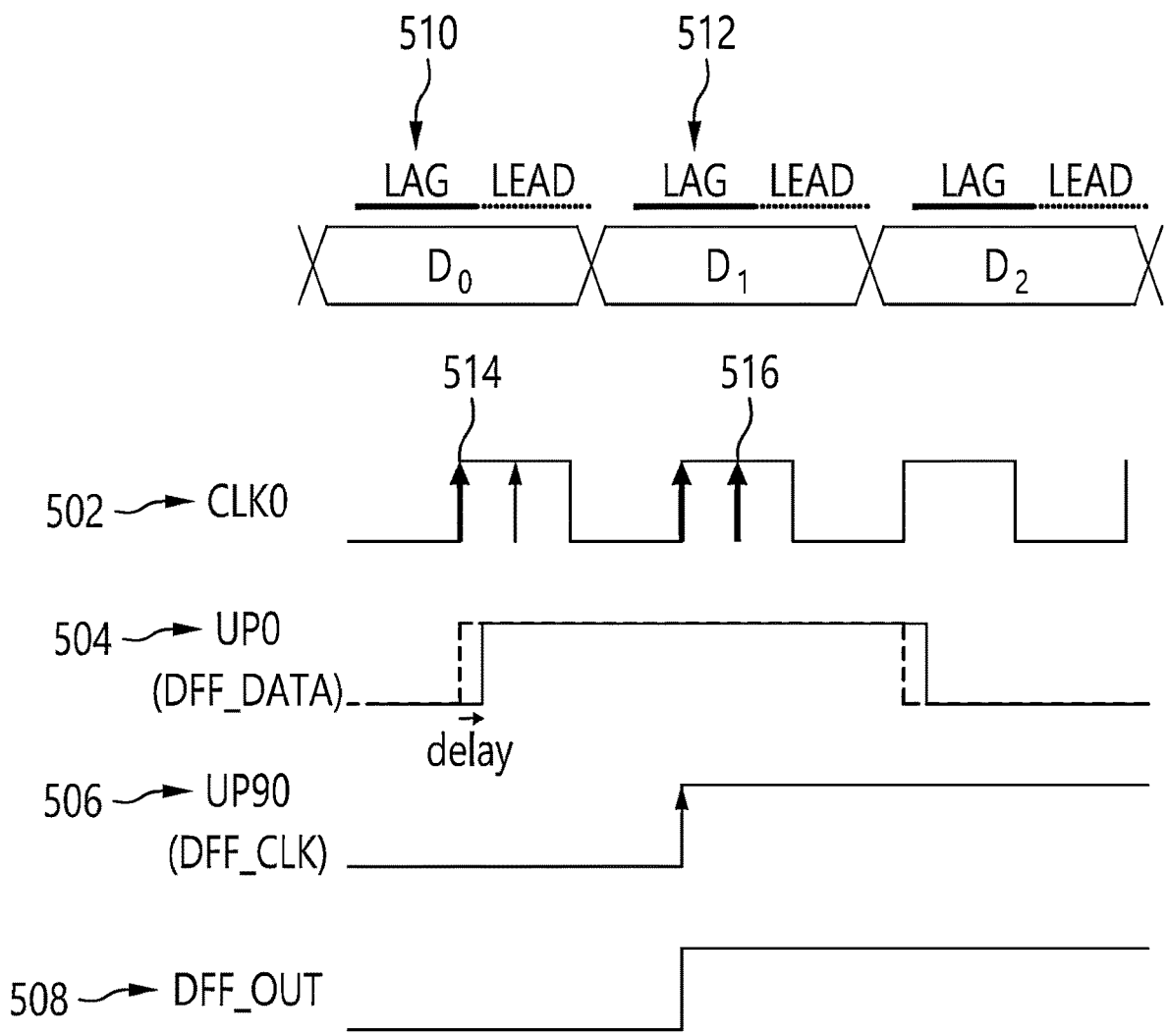
FIGS. 5a and 5b are diagrams showing an example to explain the process of outputting an FH signal from FD.
Figure 5B:
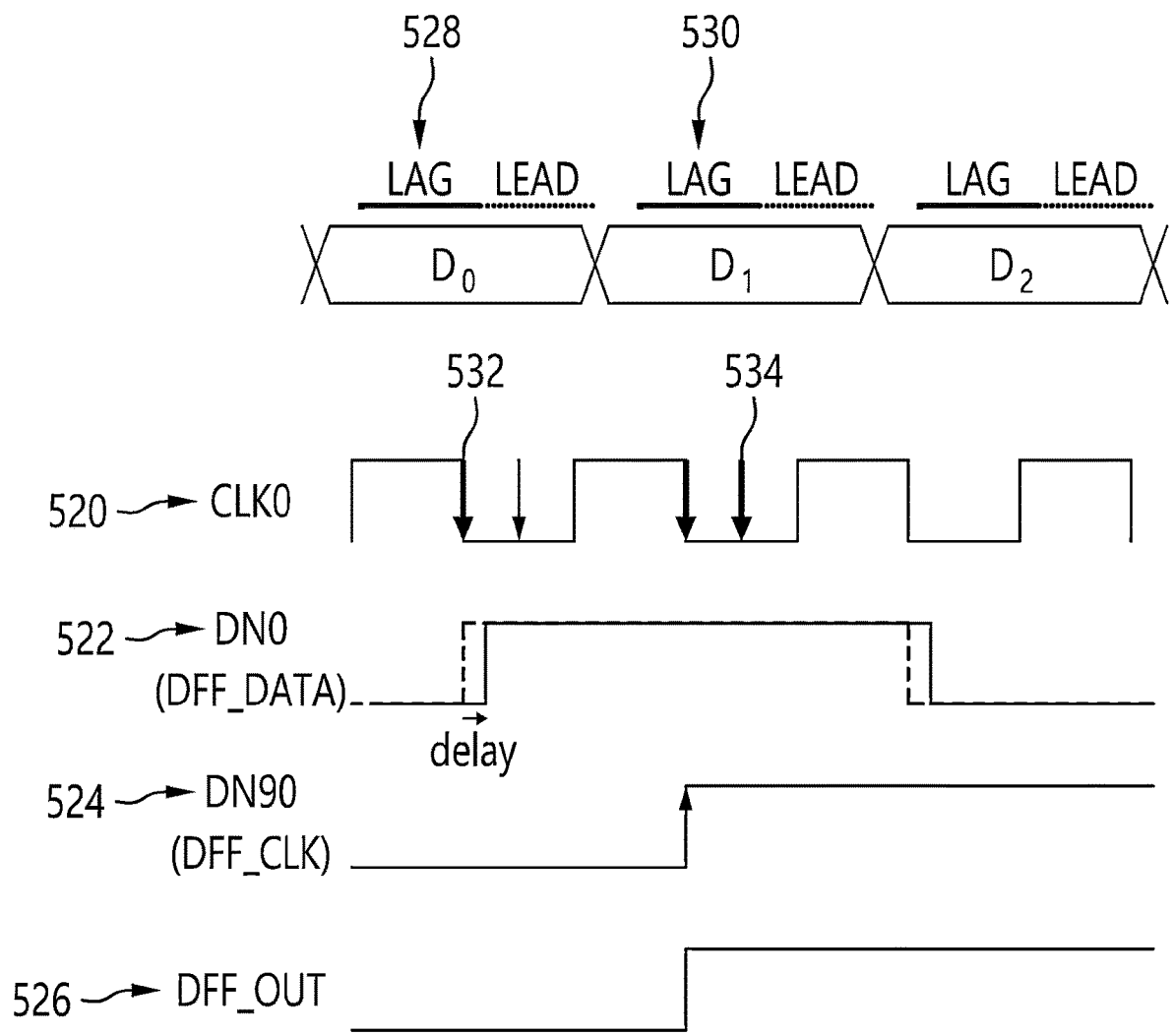

FIGS. 5a and 5b are diagrams showing an example to explain the process of outputting an FH signal from the FD.

Referring to FIG. 5a, since the clock frequency is higher than the data rate, the clock signal moves forward. Reference numeral 502 represents a timing diagram of the clock signal CLK0, and it can be seen that the rising edge enters the lag area in the order of CLK0→CLK90. That is, the rising edge 514 of CLK0 enters the first lag area 510 and the rising edge 516 of CLK90 enters the second lag area 512. At this time, it can be determined that the rising edge 514 of CLK0 has entered the first lag area 510 by the occurrence of UP0($D_{180} \oplus D_{360}$), and that the rising edge 516 of CLK90 has entered the second lag area 512 by the occurrence of UP90 ($D_{270} \oplus D_{450}$). Here, $D_{180}$ refers to data that has been sampled at clock 180° phase and then realigned in the same phase, $D_{360}$ refers to data that has been sampled at clock 360° phase and then realigned, and $D_{270}$ refers to data that has been sampled at clock 270° phase and then realigned. $D_{450}$ refers to data that has been sampled at clock 450° phase and then realigned.

Reference numeral 504 represents a timing diagram of the UP0 signal inputted to the data path of the DFF 412 in FIG. 4 and it can be seen that the UP0 signal is a signal that has passed through the delay 404 and is outputted after a certain delay time.

Reference numeral 506 represents a timing diagram of the UP90 signal inputted to the clock path of the DFF 412, and reference numeral 508 represents a timing diagram of output signal of the DFF 412, that is, the FH signal.

Referring to FIG. 5*b*, since the clock frequency is higher than the data rate, the clock signal moves forward. Reference numeral 520 represents a timing diagram of the clock signal CLK0, and it can be seen that the falling edge enters the lag area in the order of CLK0→CLK90. That is, the falling edge 532 of CLK0 enters the first lag area 528 and the falling edge 534 of CLK90 enters the second lag area 530. Here, the falling edge entering the lag area in the order of CLK0→CLK90 is the same as the rising edge entering the lag area in the order of CLK180→CLK270.

In addition, the fact that the falling edge 532 of CLK0 has entered the first lag area 528 can be determined by the occurrence of DN0 ($D_0 \oplus D_{180}$), and the fact that the falling edge 534 of CLK90 has entered the second lag area 530 can be determined by the occurrence of DN90 ($D_{90} \oplus D_{270}$). Here, $D_0$ refers to data that has been sampled at clock 0° phase and then realigned, $D_{180}$ refers to data that has been sampled at clock 180° phase and then realigned, and $D_{90}$ refers to data that has been sampled at clock 90° phase and then realigned. $D_{270}$ refers to data that has been sampled at clock 270° phase and then realigned.

Reference numeral 522 represents a timing diagram of the DN0 signal inputted to the data path of the DFF 410. It can be seen that the DN0 signal is a signal that has passed through the delayer 402 and is outputted after a certain delay time.

Reference numeral 524 represents a timing diagram of the DN90 signal input to the clock path of the DFF 410, and reference numeral 526 represents a timing diagram of the output signal of the DFF 410, that is, the FH signal.

Figure 6A:
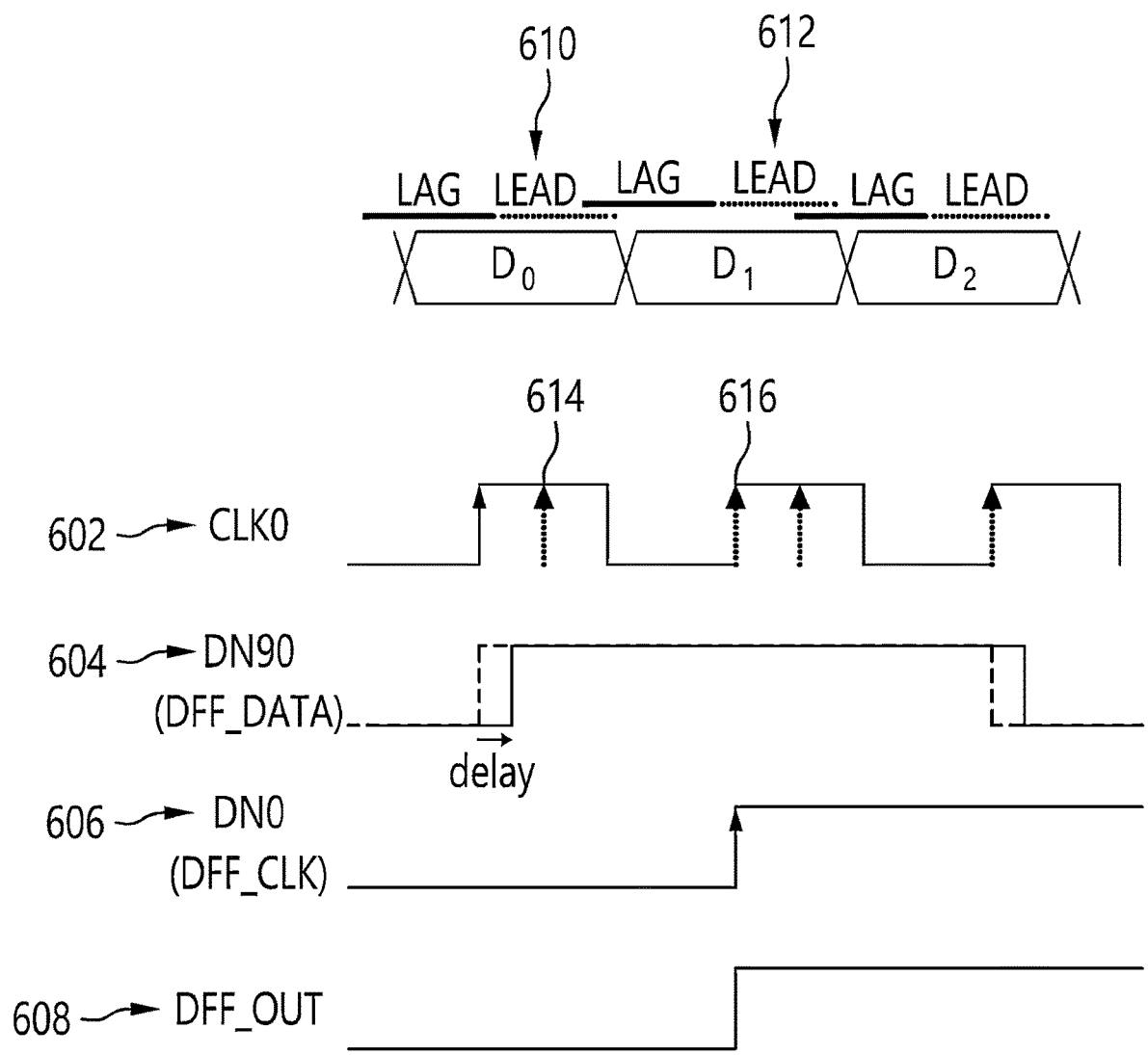
FIGS. 6a and 6b are diagrams showing an example to explain the process of outputting a FL signal from FD.
Figure 6B:
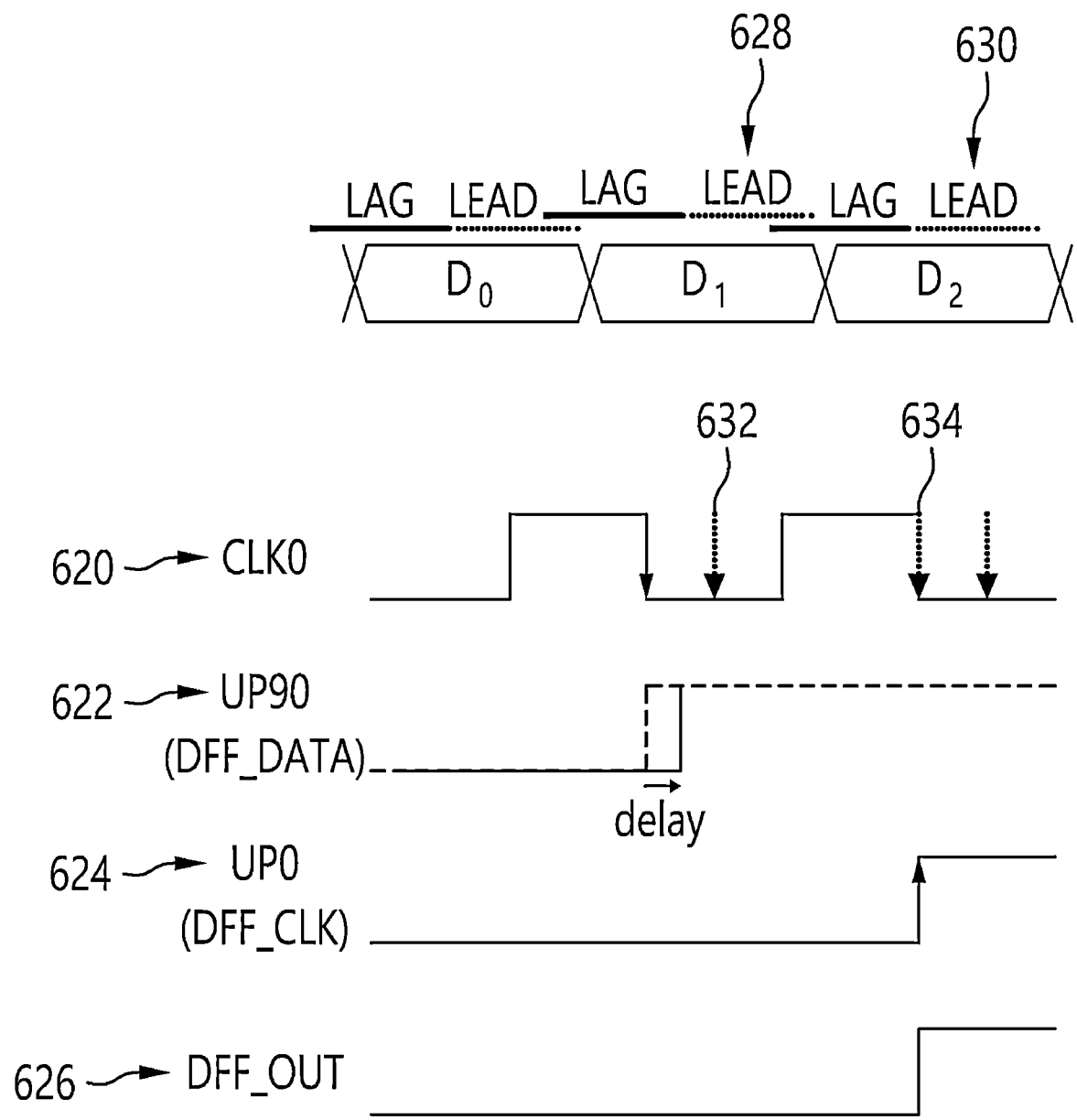

FIGS. 6*a* and 6*b* are diagrams showing an example to explain the process of outputting a FL signal from the FD.

Referring to FIG. 6*a*, since the clock frequency is lower than the data rate, the clock signal moves backward. Reference numeral 602 represents a timing diagram of the clock signal CLK0, and it can be seen that the rising edge enters the read area in the order of CLK90→CLK0. That is, the rising edge 614 of CLK90 enters the first lead area 610 and the rising edge 616 of CLK0 enters the second lead area 612. At this time, the fact that the rising edge 614 of CLK90 has entered the first lead area 610 can be determined by the occurrence of DN90 ($D_{90} \oplus D_{270}$), and the fact that the rising edge 616 of CLK0 has entered the second lead area 612 can be determined by the occurrence of DN0 ($D_0 \oplus D_{180}$). Here, $D_{90}$ refers to data that has been sampled at clock 90° phase and then realigned, $D_{270}$ refers to data that has been sampled at clock 270° phase and then realigned, and $D_0$ refers to data that has been sampled at clock 0° phase and then realigned. $D_{180}$ refers to data that has been sampled at clock 180° phase and then realigned.

Reference numeral 604 represents a timing diagram of the DN90 signal inputted to the data path of the DFF 416, and it can be seen that the DN90 signal is a signal that has passed through the delay 408 and is outputted after a certain delay time.

Reference numeral 606 represents a timing diagram of the DN0 signal inputted to the clock path of the DFF 416, and reference numeral 608 represents a timing diagram of the output signal of the DFF 416, that is, the FL signal.

Referring to FIG. 6*b*, since the clock frequency is lower than the data rate, the clock signal moves backward. Reference numeral 620 represents a timing diagram of the clock signal CLK0, and it can be seen that the falling edge enters the read area in the order of CLK90→CLK0. That is, the falling edge 632 of CLK90 enters the first lead area 628 and the falling edge 634 of CLK0 enters the second lead area 630. Here, the falling edge entering the lead area in the order of CLK90→CLK0 is the same as the rising edge entering the lead area in the order of CLK270→CLK180.

Additionally, the fact that the falling edge 632 of CLK90 has entered the first lead area 628 can be determined by the occurrence of UP90 ($D_{270} \oplus D_{450}$), and the falling edge 634 of CLK0 has entered the second lead area 630 can be determined by the occurrence of UP0 ($D_{180} \oplus D_{360}$). Here, $D_{270}$ refers to data that has been sampled at 270° phase of the clock and then realigned, $D_{450}$ refers to data sampled at 450° phase of the clock and then realigned, and $D_{180}$ refers to data that has been sampled at 180° phase of the clock and then realigned. $D_{360}$ refers to data that has been sampled at 360° phase of the clock and then realigned.

Reference numeral 622 represents a timing diagram of the UP90 signal inputted to the data path of the DFF 414, and it can be seen that the UP90 signal is a signal that has passed through the delay 406 and is outputted after a certain delay time.

Reference numeral 624 represents a timing diagram of the UP0 signal inputted to the clock path of the DFF 414, and reference numeral 626 represents a timing diagram of the output signal of the DFF 414, that is, the FL signal.

Figure 7A:
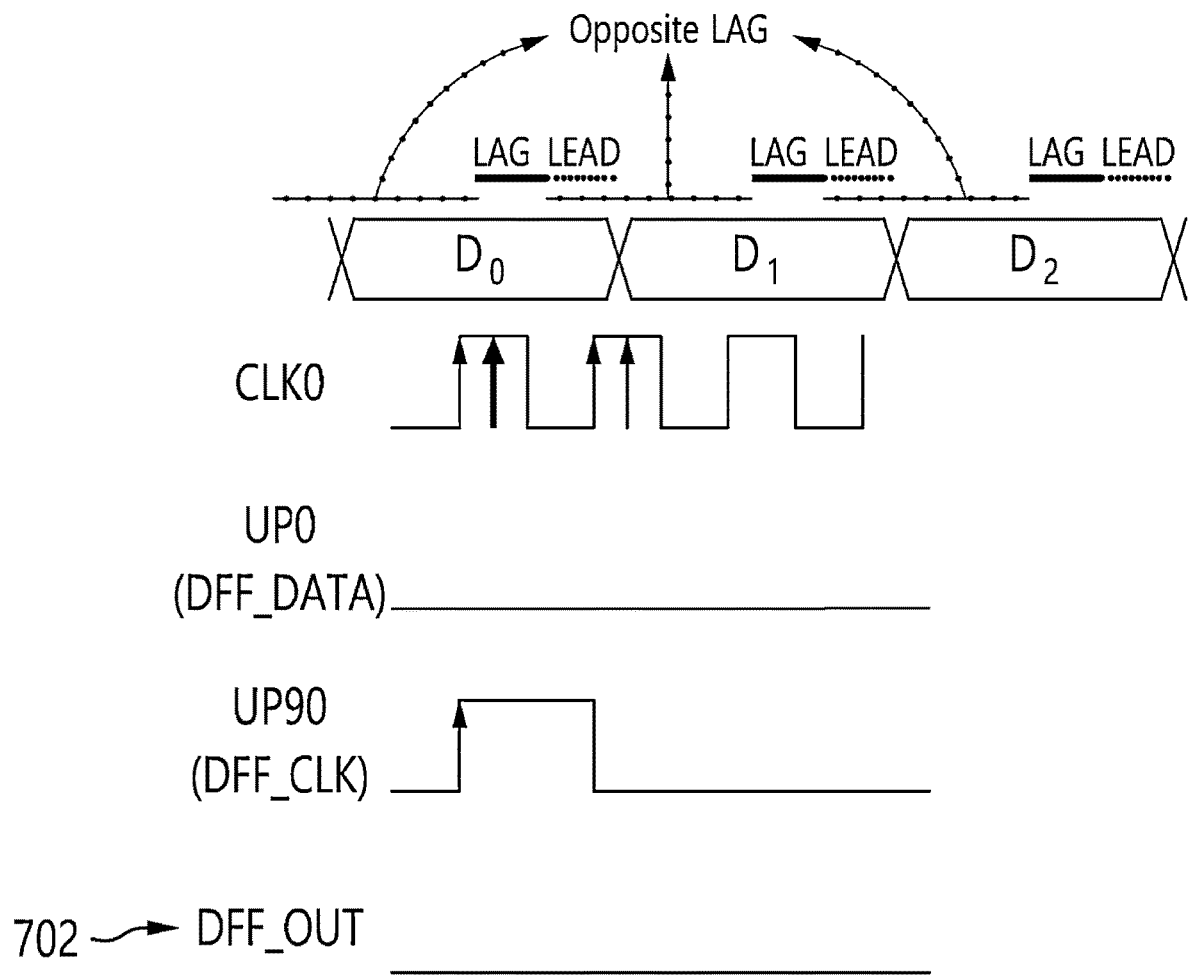
FIGS. 7a and 7b are diagrams showing examples to explain the process of outputting the FUH signal from FD.
Figure 7B:
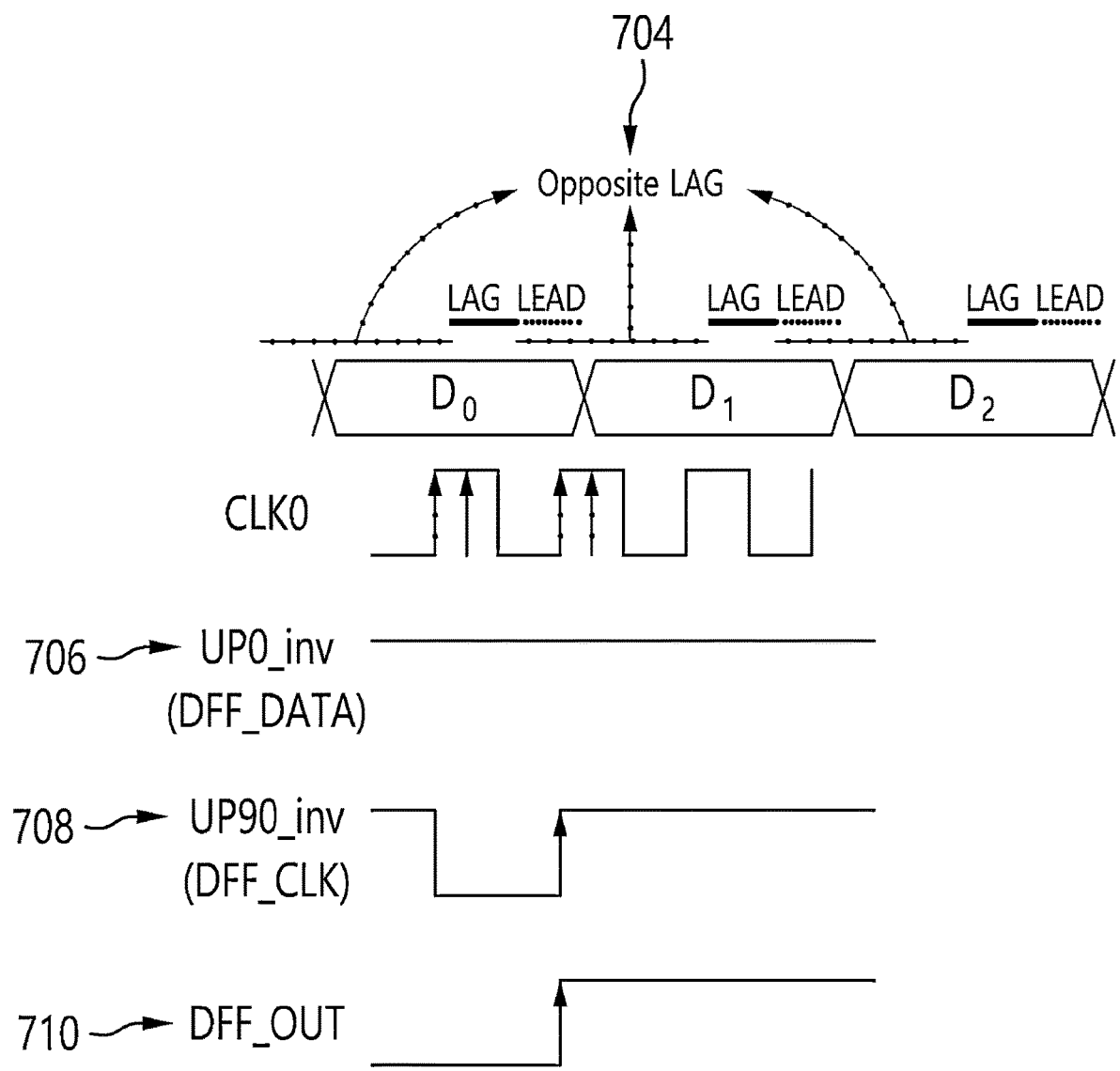

FIGS. 7*a* and 7*b* are diagrams showing an example to explain the process of outputting the FUH signal from the FD.

Referring to FIGS. 7*a* and 7*b*, when the clock frequency is higher than a predetermined multiple of the data rate, such as 1.75 times as shown in FIG. 7*a*, the frequency information is not detected as represented by reference numeral 702 due to a decrease in the lag area. Accordingly, in an embodiment of the present invention, an opposite lag area 704, which is an opposite area of the lag area, is used as shown in FIG. 7*b*, and an FUH signal is outputted as represented by reference numeral 710 through this.

Reference numeral 706 represents a timing diagram of the UP0 signal that is inputted to the data path of the DFF 418 and that has passed through the NOT gate 430, and reference numeral 708 represents a timing diagram of the UP0 signal that is inputted to the clock path of the DFF 418 and that has passed through the NOT gate 432.

Table 1 below shows the possibility of occurrence of FUH, FH, FL, CFUP (Continuous Frequency Up) and CFDN (Continuous Frequency Down) signals based on the relationship between clock frequency and data rate.

TABLE 1

| Relationship between clock frequency and data rate | Possibility of occurrance of the corresponding signal | | | | |
|---|---|---|---|---|---|
| | FUH | FH | FL | CFUP | CFDN |
| $f_c > 1.75 f_D$ | ◯ | X | X | X | ◯ |
| $f_D < f_c < 1.75 f_D$ | ◯ | ◯ | X | X | ◯ |

TABLE 1-continued

| Relationship between clock frequency and data rate | Possibility of occurrance of the corresponding signal | | | | |
|---|---|---|---|---|---|
| | FUH | FH | FL | CFUP | CFDN |
| $0.875f_D < f_c < f_D$ | ○ | X | ○ | ○ | X |
| $f_c < 0.875f_D$ | ○ | ○ | ○ | ○ | X |

Meanwhile, a frequency tracking refers to a technology that maintains a constant frequency by automatically adjusting the operating frequency of the circuit based on a target frequency. In the embodiment of the present invention, the frequency tracking is performed using the FUH, FH, FL CFUP and CFDN signals.

The operation of adjusting the clock frequency through the frequency tracking is divided into frequency adjustment in a coarse adjustment stage and frequency adjustment in a fine adjustment stage. Here, the frequency adjustment in the coarse adjustment stage is a technique of reducing the frequency error by moving to a frequency higher or lower than the current frequency at regular intervals, and the frequency adjustment in the fine adjustment stage is a technique of performing a more fine adjustment after detecting the coarse frequency.

Additionally, the CFUP and CFDN signals generated by the FUH, FH and FL signals are used for frequency adjustment in the coarse adjustment stage to quickly track the large difference between the target frequency and the clock frequency to reduce the offset. In addition, the FH and FL signals generated when the clock frequency is higher than the data rate and lower than 1.75 times the data rate, and when the clock frequency is lower than the data rate and higher than 0.875 times the data rate, are used for fine frequency adjustment in the fine adjustment stage.

Figure 8:
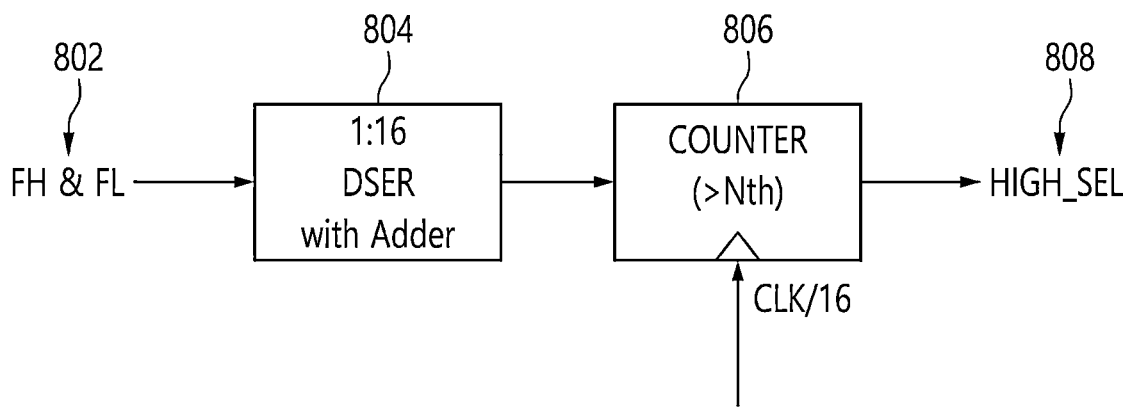
FIG. 8 is an apparatus diagram showing the internal blocks of the FH/FL detector included in the FD of FIG. 4.

FIG. 8 is an apparatus diagram showing the internal blocks of the FH/FL detector included in the FD of FIG. 4.

Referring to FIG. 8, the illustrated FH/FL detector 442 includes a deserializer (DSER) 804 and a counter 806.

The FUH signal is generated when the clock frequency is higher than 1.75 times the data rate and is used by default. However, if frequency detection is performed using only the FUH signal, when the opposite situation, that is, the clock frequency is lower than the data rate, the frequency tracking is disrupted. Therefore, when the FH/FL detector 442 detects an FH or FL signal, FH/FL detector 442 outputs the FH signal to the MUX 438 because the FH signal is used as frequency information in FUH.

That is, the DSER 804 monitors the FH and FL signals 802 every 16 cycles of the clock to detect the FH signal and/or the FL signal, and the counter 806 detects the FH signal and/or FL signal every 16 cycles. When detected more than twice in succession, a HIGH_SEL signal (808) that converts the FUH signal into an FH signal is outputted.

Figure 9:
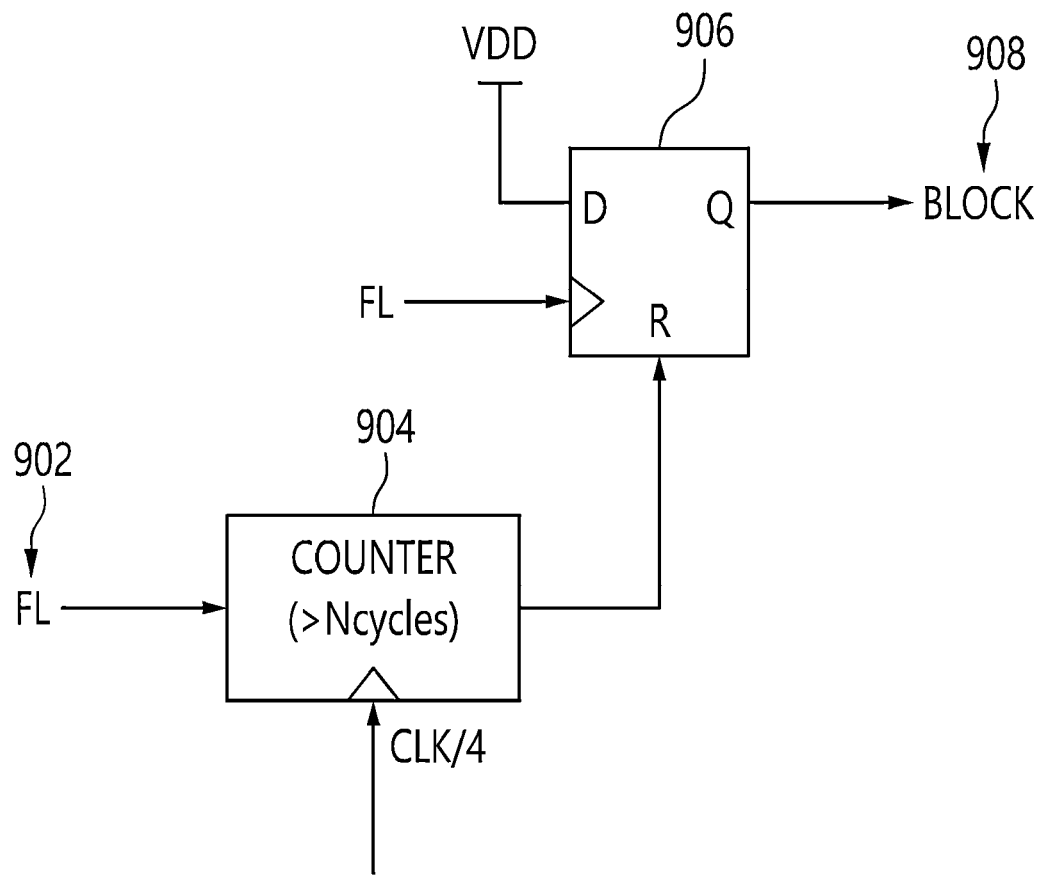
FIG. 9 is an apparatus diagram showing the internal blocks of the block signal generator included in the FD of FIG. 4.

FIG. 9 is an apparatus diagram showing the internal blocks of the block signal generator included in the FD of FIG. 4.

Referring to FIG. 9, the illustrated block signal generator 440 includes a counter 904 and a DFF 906.

The FH signal generated when the clock frequency is lower than 0.85 times the data rate disrupts frequency tracking, and thus the block signal generator 440 outputs a block signal to block the FH signal which is an unwanted signal.

That is, the counter 904 monitors the FL signal 902 for 124 clock cycles to detect the FL signal, and if the FL signal is not detected, the counter 904 determines that the clock frequency is out of the low range and resets the block signal. Through this, the DFF 906 outputs a block signal 908 that blocks the FH signal.

Figure 10A:
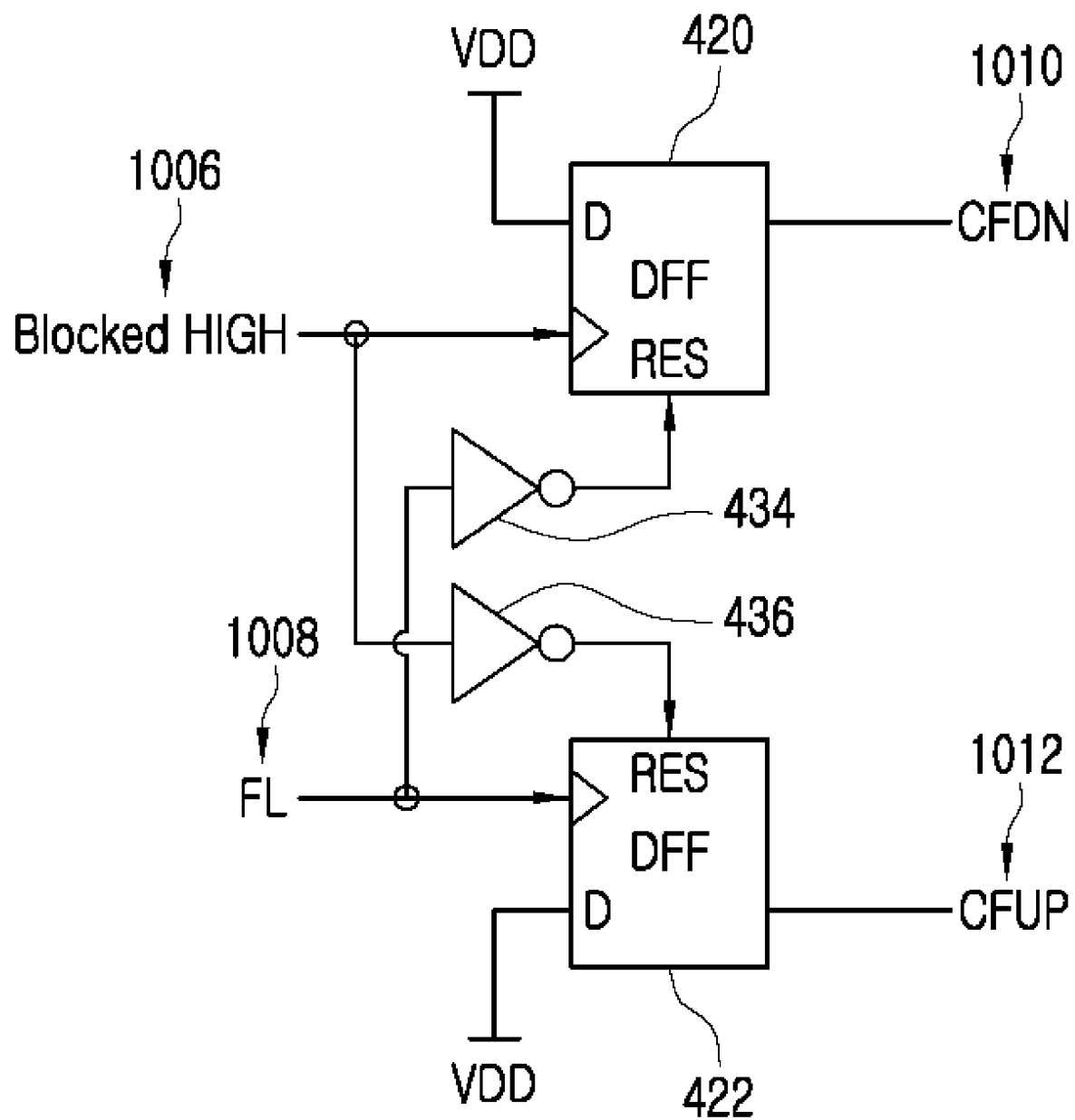
FIGS. 10a and 10b are diagrams showing components that output CFDN signals and CFUP signals in the FD of FIG. 4 and their simulation results.
Figure 10B:
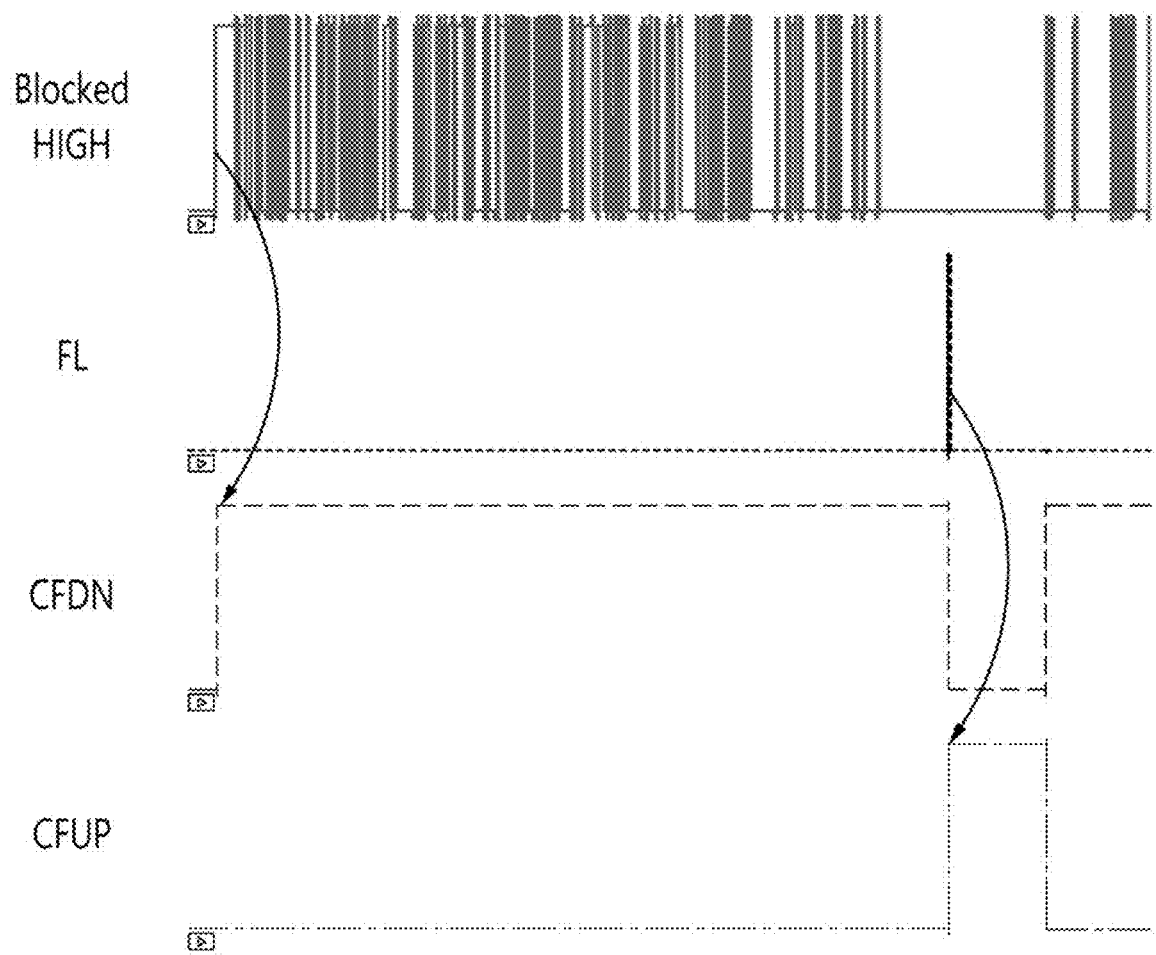

FIGS. 10a and 10b are diagrams illustrating components that output a CFDN signal and a CFUP signal in the FD of FIG. 4 and its simulation results.

Referring to FIGS. 10a and 10b, as shown in FIG. 10a, when the first DFF 420 receives a Blocked HIGH signal 1006 which is blocked by the BLOCK signal 908 outputted from a block signal generator 440 and a FL signal 1008 which has passed through a NOT gate 434a, the first DFF 420 outputs a CFDN signal 1010, and when the second DFF 422 receives the FL signal 1008 and a Blocked HIGH signal 1006 which has passed through the NOT gate 436, the second DFF 422 outputs a CFUP signal 1012. At this time, the first DFF 420 and the second DFF 422 operate complementary.

Looking at the simulation results in this case through FIG. 10b, it can be seen that the CFDN signal was generated due to the generation of the blocked HIGH signal, the CFDN signal was reset to low at the same time as the generation of the FL signal and the CFUN signal was generated from low to high. At this time, the CFDN signal and the CFDN signal have a step function waveform to obtain a fast frequency acquisition time.

Figure 11:
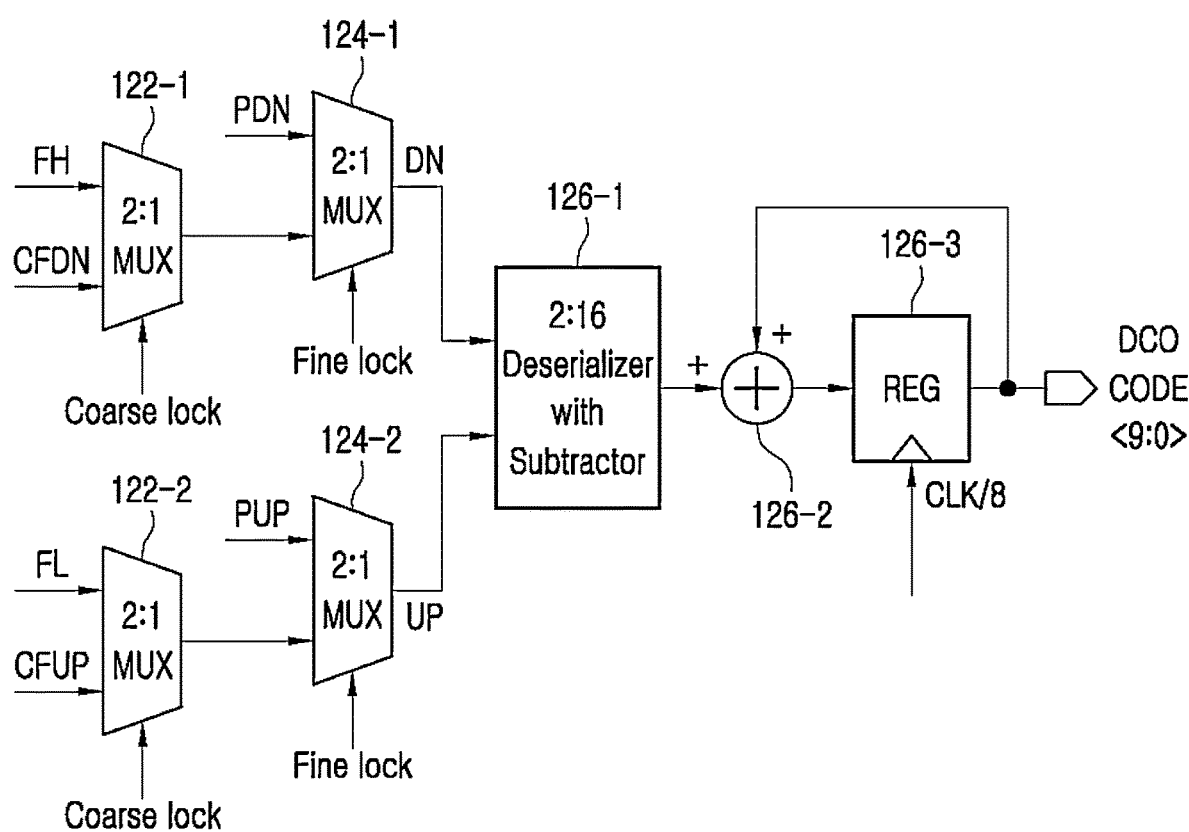
FIG. 11 is an apparatus diagram showing detailed blocks of components included in the DLF part of FIG. 1.

FIG. 11 is an apparatus diagram showing detailed blocks of components included in the DLF unit of FIG. 1.

Referring to FIG. 11, a DCO code is updated according to the clock divided by 8, and when a coarse lock is made, the frequency signal used for frequency detection is converted from the CFDN/CFUP signal to the FH/FL signal. Here, the coarse lock refers to a state in which the clock frequency of the coarse stage is adjusted and thus the frequency is locked. Thereafter, when a fine lock signal is generated by the frequency lock detector 130, it proceeds to the phase detection stage and outputs a PUP/PDN signal to thereby affect the DCO code.

That is, the coarse lock signal is inputted to each of the first and third MUXs 122-1 and 122-2, and a fine lock signal is inputted to each of the second and fourth MUXs 124-1 and 124-2. Additionally, the FH signal and CFDN signal are inputted to the first MUX 122-1, and the second MUX 124-1 outputs a DN signal. The FL signal and CFUP signal are inputted to the third MUX 122-2, and the fourth MUX 124-2 outputs the UP signal.

The DN signal and the UP signal pass through a deserializer 126-1, a summer 126-2 and a 10-bit register 126-3, and finally a DCO code is outputted.

Meanwhile, the frequency lock detector 130 outputs a coarse lock signal to lock the clock frequency of the coarse stage if the FH occurs after the HIGH_SEL signal that converts the FUH signal to FH signal was outputted, and the frequency lock detector 130 outputs a fine lock signal to lock the clock frequency of the fine stage if the UP0 or DN0 signal remains at LOW for 124 clock cycles after the coarse lock signal was outputted or the FL signal is detected.

Figure 12:
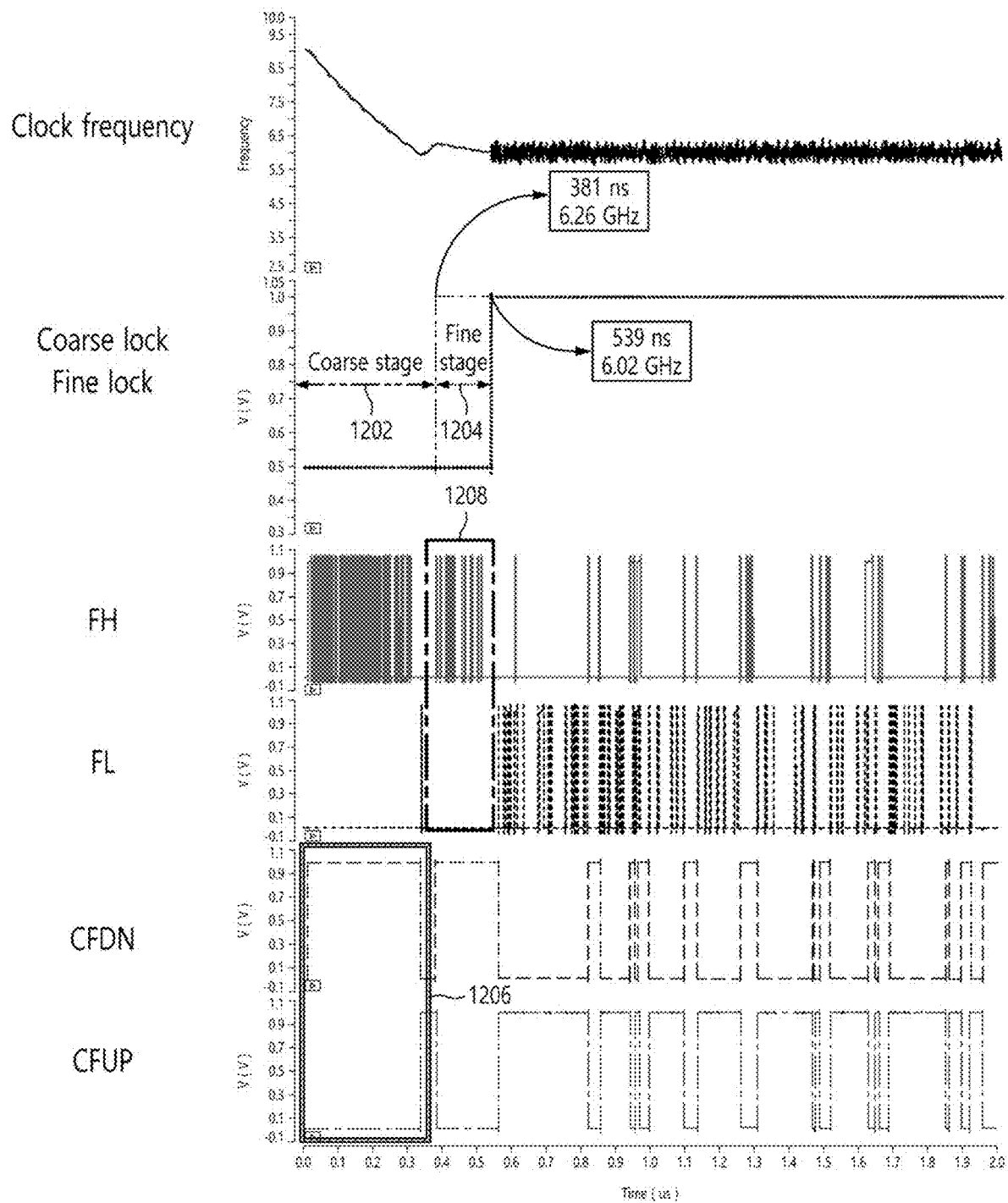
FIG. 12 is a graph showing simulation results of a CDR circuit according to an embodiment of the present invention.

FIG. 12 is a graph showing simulation results of a CDR circuit according to an embodiment of the present invention.

Referring to FIG. 12, the simulation results of the illustrated graph assumed that the input data rate is 6 Gbps and the initial clock frequency is 9 GHz. It can be seen that in the coarse stage 1202, the clock frequency is quickly reduced using the CFSDN and CFUP signals corresponding to the reference numeral 1206, and in the fine stage 1204, the clock frequency is gradually fine-adjusted using the FH and FL signals corresponding to the reference numeral 1208.

Figure 13:
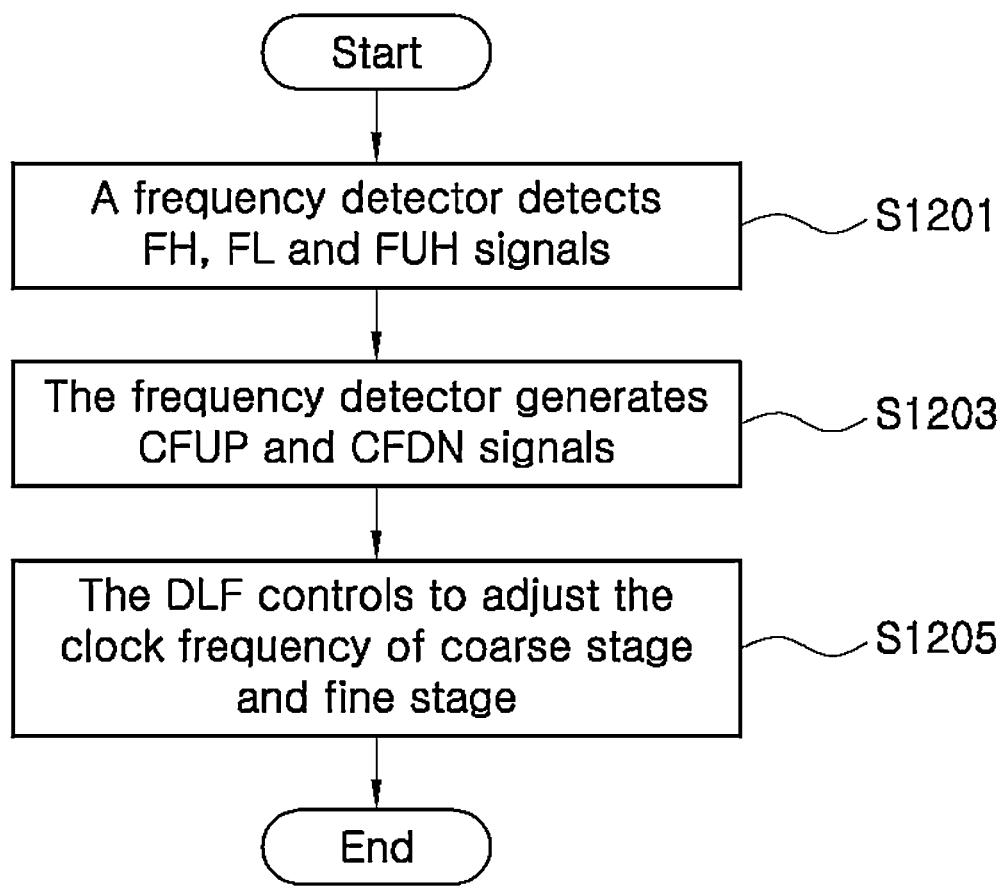
FIG. 13 is a flowchart showing the operation of the CDR apparatus according to an embodiment of the present invention.

FIG. 13 is a flowchart showing the operation of a CDR apparatus according to an embodiment of the present invention.

Referring to FIG. 13, the frequency detector of the CDR apparatus determines the relationship between the data rate of the input data and the clock frequency and detects FH, FL and FUH signals (S1201), and generates CFUP and CFDN signals based on the FH, FL, and FUH signals (S1203). In the S1201, the frequency detector detects the FH signal if the clock frequency is higher than the data rate, detects the FL signal if the clock frequency is lower than the data rate, and detects the FUH signal if the clock frequency is higher than a predetermined multiple of the data rate.

And then, the DLF of the CDR apparatus adjusts the clock frequency of the coarse stage using the CFUP and CFDN signals, and controls to adjust the clock frequency of the fine stage using the FH and FL signals (S1205).

The method for digital clock and data recovery proposed in the present invention can be implemented in the form of program instructions that can be executed through various computer components and recorded on a computer-readable recording medium. The computer-readable recording medium may include program instructions, data files, data structures, etc. singly or in combination.

The program instructions recorded on the computer-readable recording medium may be specially designed and configured for the present invention, or may be known and usable by those skilled in the computer software field.

Examples of the computer-readable recording medium may include a magnetic medium such as hard disks, floppy disks and magnetic tapes, an optical recording medium such as CD-ROMs and DVDs, a magneto-optical medium such as floptical disks, and hardware devices such as ROM, RAM, flash memory, etc. specifically configured to store and execute program instructions.

Examples of program instructions may include not only machine language code such as that created by a compiler, but also high-level language code that can be executed by a computer using an interpreter or the like. The hardware device may be configured to operate as one or more software modules to perform processing according to the present invention and vice versa.

Although various embodiments of the present invention have been shown and described above, the present invention is not limited to the specific embodiments described above, and may be used in the technical field to which the invention pertains without departing from the gist of the invention as claimed in the claims. Of course, various modifications can be made by those skilled in the art, and these modifications should not be understood individually from the technical idea or perspective of the present invention.

The invention claimed is:

1. An apparatus for digital clock data recovery (CDR), comprising:
    a frequency detector for detecting a high frequency (FH) signal, a low frequency (FL) signal and an ultra-high frequency (FUH) signal by determining a relationship between an input data rate and a clock frequency, and generating a continuous frequency up (CFUP) signal and a continuous frequency down (CFDN) signal based on the FH, FL and FUH signals;
    a digital loop filter (DLF) for adjusting the clock frequency in a coarse adjustment stage using the CFUP and CFDN signals and for adjusting the clock frequency in a fine adjustment stage using the FH and FL signals.

2. The apparatus according to claim 1, wherein the frequency detector generates the CFDN signal based on a HIGH signal blocked by a block signal and the FL signal which has passed through a NOT gate, and generates the CFUP signal based on the FL signal which has not passed through the NOT gate and the blocked HIGH signal which has passed through the NOT gate.

3. The apparatus according to claim 1, wherein the frequency detector includes a FH/FL detector for outputting a HIGH_SEL signal that converts the FUH signal into the FH signal when at least one of the FH signal and the FL signal is detected continuously in two or more sets, each set referring to 16 cycles of the clock.

4. The apparatus according to claim 2, wherein the frequency detector includes a block signal generator which outputs the block signal that blocks the HIGH signal and which is deactivated when the FL signal is not detected during a clock cycle.

5. The apparatus according to claim 1, further comprising a frequency lock detector for locking the clock frequency in the coarse adjustment stage if the FH signal occurs after a HIGH_SEL signal that converts the FUH signal to the FH signal is outputted and for locking the clock frequency in the fine adjustment stage if an UP0 signal or a DN0 signal remains at 0 (LOW) or the FL signal is detected, during a clock cycle.

6. The apparatus according to claim 1, wherein the frequency detector detects the FH signal when the clock frequency is higher than the input data rate, detects the FL signal when the clock frequency is lower than the input data rate, and detects the FUH signal when the clock frequency is higher than a multiple of input data rate.

7. A method for digital clock data recovery (CDR), comprising the steps of:
    detecting, by a frequency detector, a high frequency (FH) signal, a low frequency (FL) signal and an ultra-high frequency (FUH) signal by determining a relationship between an input data rate and a clock frequency;
    generating, by the frequency detector, a continuous frequency up (CFUP) signal and a continuous frequency down (CFDN) signal based on the FH, FL and FUH signals; and
    adjusting, by a digital loop filter (DLF), a clock frequency in a coarse adjustment stage using the CFUP and CFDN signals and a clock frequency in a fine adjustment stage using the FH and FL signals.

8. The method according to claim 7, wherein the step of generating, by the frequency detector, the CFUP and CFDN signals includes generating the CFDN signal based on a HIGH signal blocked by a block signal and the FL signal which has passed through a NOT gate, and generating the CFUP signal based on the FL signal which has not passed through the NOT gate and the blocked HIGH signal which has passed through the NOT gate.

9. The method according to claim 7, further comprising the step of outputting, by a FH/FL detector, a HIGH_SEL signal that converts the FUH signal into the FH signal when at least one of the FH signal and the FL signal is detected continuously in two or more sets, each set referring to 16 cycles of the clock.

10. The method according to claim 8, wherein the step of generating, by the frequency detector, the CFUP and CFDN signals includes outputting, by a block signal generator, the block signal that blocks the HIGH signal and deactivating the block signal generator when the FL signal is not detected during a clock cycle.

11. The method according to claim 7, further comprising the step of locking, by a frequency lock detector, the clock frequency in the coarse adjustment stage if the FH signal occurs after a HIGH_SEL signal that converts the FUH signal to the FH signal is outputted and the clock frequency in the fine adjustment stage if an UP0 signal or a DN0 signal remains at 0 (LOW) or the FL signal is detected, during a clock cycle.

12. The method according to claim 7, wherein the step of detecting, by the frequency detector, the FH, FL and FUH signals includes detecting the FH signal when the clock frequency is higher than the input data rate, detecting the FL signal when the clock frequency is lower than the input data rate, and detecting the FUH signal when the clock frequency is higher than a multiple of the input data rate.

13. A non-transitory recording medium on which a computer program for performing the method of claim 7 is recorded.

* * * * *